US010896816B2

United States Patent
Bi et al.

(10) Patent No.: US 10,896,816 B2
(45) Date of Patent: Jan. 19, 2021

(54) SILICON RESIDUE REMOVAL IN NANOSHEET TRANSISTORS

(71) Applicant: International Business Machines Corporation, Armonk, NY (US)

(72) Inventors: Zhenxing Bi, Niskayuna, NY (US); Thamarai S. Devarajan, Albany, NY (US); Nicolas J. Loubet, Guilderland, NY (US); Binglin Miao, Loudonville, NY (US); Muthumanickam Sankarapandian, Niskayuna, NY (US); Charan V. Surisetty, Milpitas, CA (US); Chun W. Yeung, Niskayuna, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/715,559

(22) Filed: Sep. 26, 2017

(65) Prior Publication Data
US 2019/0096669 A1     Mar. 28, 2019

(51) Int. Cl.
| | |
|---|---|
| *H01L 21/02* | (2006.01) |
| *H01L 29/775* | (2006.01) |
| *H01L 29/786* | (2006.01) |
| *H01L 29/40* | (2006.01) |
| *B82Y 10/00* | (2011.01) |
| *H01L 29/06* | (2006.01) |
| *H01L 29/66* | (2006.01) |
| *H01L 29/423* | (2006.01) |

(52) U.S. Cl.
CPC .......... *H01L 21/0206* (2013.01); *B82Y 10/00* (2013.01); *H01L 21/02* (2013.01); *H01L 29/0673* (2013.01); *H01L 29/401* (2013.01); *H01L 29/42392* (2013.01); *H01L 29/66439* (2013.01); *H01L 29/775* (2013.01); *H01L 29/78696* (2013.01)

(58) Field of Classification Search
CPC .................... H01L 21/02524; H01L 21/02664
See application file for complete search history.

(56) References Cited

U.S. PATENT DOCUMENTS

| | | | |
|---|---|---|---|
| 7,250,085 B2 | 7/2007 | Abadie et al. | |
| 7,800,152 B2 | 9/2010 | Zhu et al. | |
| 8,431,453 B2 | 4/2013 | Huang et al. | |
| 8,916,477 B2 | 12/2014 | Thedjoisworo et al. | |

(Continued)

OTHER PUBLICATIONS

Hyun-Mog Park, et al.: "Etch Profile Control of High-Aspect Rattion Deep Submicrometer a-Si Gate Etch"; IEEE Transactions on Semiconductor Manufacturing, vol. 14 No. 13 Aug. 2001; pp. 13.

(Continued)

*Primary Examiner* — Duy Vu N Deo
(74) *Attorney, Agent, or Firm* — Cantor Colburn LLP; Daniel Morris

(57) ABSTRACT

A method for forming a nanosheet semiconductor device includes forming a nanosheet stack comprising channel nanosheets. The method includes depositing silicon on the nanosheet stack, the silicon completely filling a space between adjacent channel nanosheets. The method includes etching the silicon. The method includes exposing the nanosheet stack to a gas phase heat treatment.

20 Claims, 12 Drawing Sheets

(56) References Cited

U.S. PATENT DOCUMENTS

| | | | |
|---|---|---|---|
| 8,941,184 B2 | 1/2015 | Ando et al. | |
| 8,969,934 B1 | 3/2015 | Cheng et al. | |
| 9,093,533 B2 | 7/2015 | Cheng et al. | |
| 9,324,576 B2 | 4/2016 | Zhang et al. | |
| 9,679,780 B1 * | 6/2017 | Bi | H01L 29/0673 |
| 9,978,678 B1 * | 5/2018 | Chao | H01L 23/5256 |
| 2003/0124824 A1 | 7/2003 | Mehrotra et al. | |
| 2010/0099263 A1 | 4/2010 | Kao et al. | |
| 2017/0104060 A1 * | 4/2017 | Balakrishnan | H01L 29/0673 |
| 2017/0323949 A1 * | 11/2017 | Loubet | H01L 29/42392 |
| 2018/0308986 A1 * | 10/2018 | Chao | H01L 29/1079 |

OTHER PUBLICATIONS

Zhenxing Bi, et al.: "Polysilicon Residue Removal in Nanosheet MOSFETS", U.S. Appl. No. 15/278,958, filed Sep. 28, 2016. pp.37.

* cited by examiner

SILICON RESIDUE REMOVAL IN NANOSHEET TRANSISTORS

BACKGROUND

The present invention relates in general to semiconductor device fabrication methods and resulting structures. More specifically, the present invention relates to silicon residue removal in a nanosheet transistor.

In semiconductor device fabrication processes, a large number of semiconductor devices, such as field effect transistors (FETs), can be fabricated on a single wafer. Some non-planar device architectures, such as nanosheet FETs, provide increased device density and can provide increased performance over lateral device architectures. In a known nanosheet FET configuration, the gate wraps around the full perimeter of multiple nanosheet channels in a so-called gate-all-around (GAA) configuration, which enables fuller depletion in the channel regions and reduces short-channel effects due to, for example, steeper subthreshold swing (SS) and smaller drain induced barrier lowering (DIBL). The wrap-around gate structures can result in greater management of leakage current and parasitic capacitance in the active regions, even as drive currents increase.

SUMMARY

Embodiments of the present invention are directed to a method for forming a nanosheet semiconductor device. A non-limiting example of the method includes forming a nanosheet stack including channel nanosheets. The method includes depositing silicon on the nanosheet stack. The silicon completely fills a space between adjacent nanosheet stack. The method includes etching the silicon. The method includes exposing the nanosheet stack to a gas phase heat treatment.

Embodiments of the present invention are directed to a method for forming a nanosheet semiconductor device. A non-limiting example of the method includes forming a nanosheet stack including channel nanosheets. The method includes depositing silicon on the nanosheet stack. The method includes etching the silicon. The method includes exposing the nanosheet stack to a gas phase heat treatment.

Embodiments of the present invention are directed to a method for forming a nanosheet semiconductor device. A non-limiting example of the method includes etching amorphous silicon on the nanosheet semiconductor device. The method includes exposing the nanosheet semiconductor device to a gas phase heat treatment.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1A:
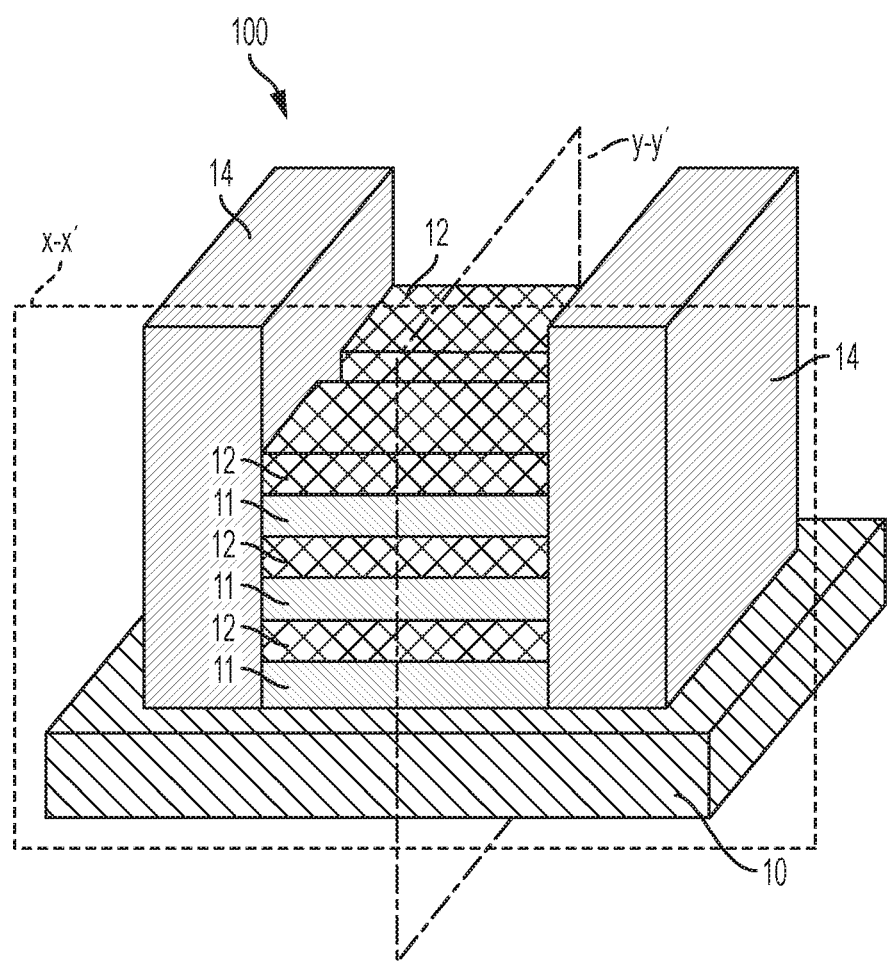
FIG. 1A depicts a perspective view of a semiconductor structure after a fabrication operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. The channel region connects the source and the drain, and electrical current flows through the channel region from the source to the drain. The electrical current flow is induced in the channel region by a voltage applied at the gate electrode.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, the previously described GAA nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. Forming the GAA nanosheets from alternating layers of channel nanosheets formed from a first type of semiconductor material (typically Si for n-type FETs and SiGe for p-type FETs) and sacrificial nanosheets formed from a second type of semiconductor material (typically SiGe for n-type FETs and Si for p-type FETs) provides superior channel electrostatics control, which is necessary for continuously scaling gate lengths down to seven (7) nanometer technology and below. The length of the gate is in a direction between the source and drain regions, and the width of the gate is in a direction orthogonal to the length. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

It is understood that although a detailed description is provided herein of an exemplary n-type "wrap-around" or "gate-all-around" (GAA) nanosheet FET architecture having silicon (Si) channel nanosheets and silicon germanium (SiGe) sacrificial nanosheets, implementation of the teachings recited herein are not limited to the particular FET architecture described herein. Rather, embodiments of the present invention are capable of being implemented in conjunction with any other type of FET device now known or later developed, including, for example, p-type GAA nanosheet FET architectures having silicon germanium channel nanosheets and silicon sacrificial nanosheets.

During formation of nanosheet FETs, an interfacial layer and a gate dielectric layer are successively formed on surfaces of the nanosheets of the FETs. The nanosheets are then subjected to an annealing process to increase the reliability of the gate dielectric layer, which can function as a gate insulation layer. Unfortunately, annealing the nanosheets can also result in oxygen diffusing through the gate dielectric layer to the interfacial layer, causing regrowth of the interfacial layer. An amorphous silicon layer can be deposited over the nanosheet FETs to prevent oxygen diffusion through the gate dielectric layer to the interfacial layer during the annealing process, preventing regrowth of the interfacial layer. Ideally, the amorphous silicon layer would be completely removed after the annealing process. Subsequent removal of the amorphous silicon layer using conventional techniques, however, results in undesirable residue.

Turning now to an overview of the aspects of the invention, one or more embodiments of the invention address the above-described shortcomings of the prior art by providing methods to effectively remove an amorphous silicon layer as well as any amorphous silicon etch byproduct residue formed during formation of nanosheet FETs. The method includes an amorphous silicon etch process followed by a post-etch gas phase heat treatment, for example, a gas phase heat treatment at a temperature between about 150° C. and 200° C. for a period of time between about 1 minute and about 5 minutes to remove etch byproducts.

The above-described aspects of the invention address the shortcomings of the prior art by causing sublimation of $(NH_4)_2SiF_6$ amorphous silicon etch byproducts into $SiF_4$ gas, $NH_3$ gas, and HF gas. Accordingly, amorphous silicon as well as amorphous silicon etch byproduct residue are effectively removed.

Figure 1B:
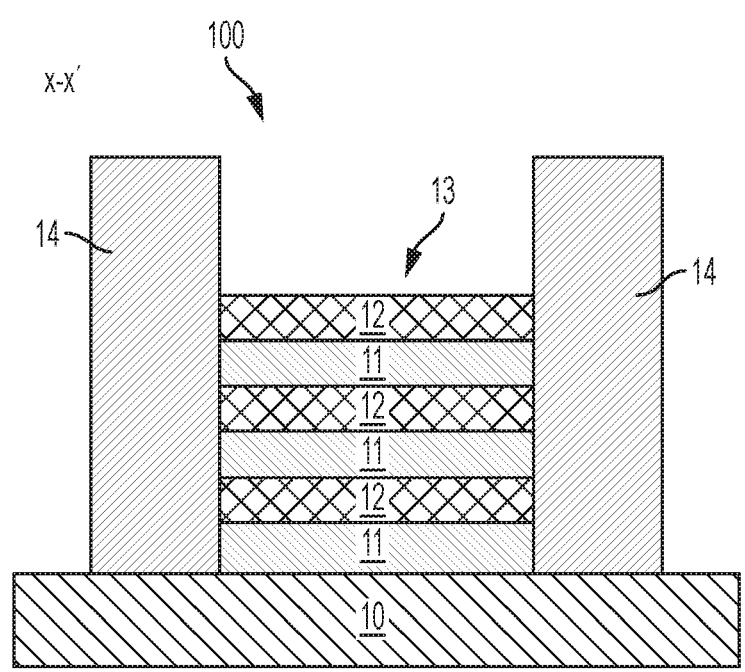
FIG. 1B depicts a cross-sectional view of the semiconductor structure shown in FIG. 1A, taken along line X-X'.
Figure 1C:
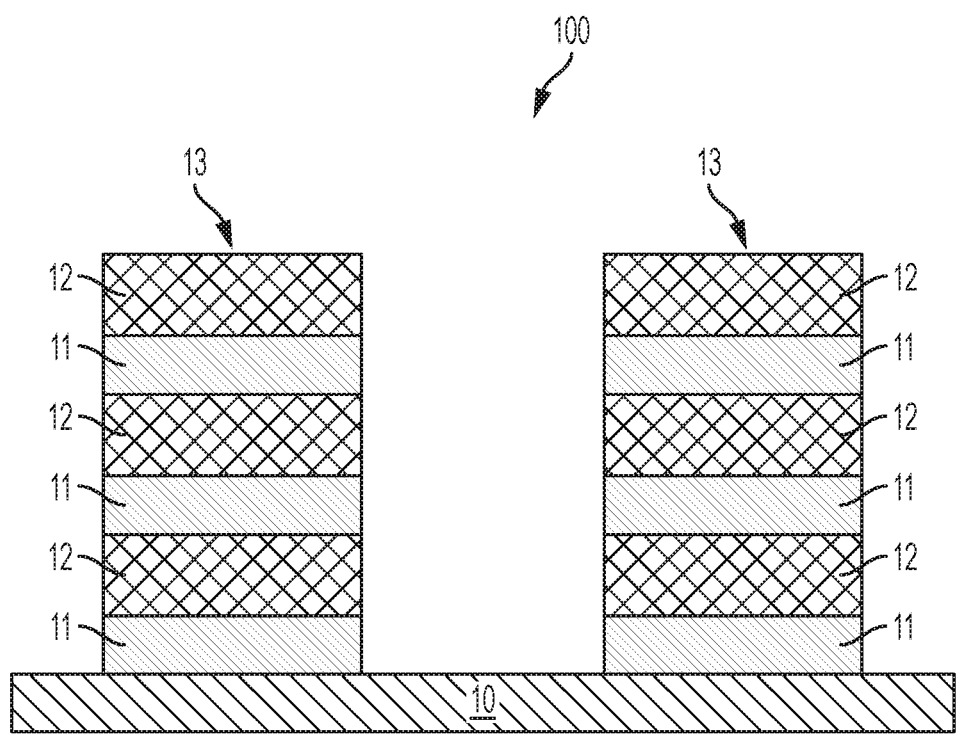
FIG. 1C depicts a cross-sectional view of the semiconductor structure shown in FIG. 1A, taken along line Y-Y'.

Turning now to a more detailed description of aspects of the present invention, FIG. 1A depicts a perspective view of a semiconductor structure 100 after various fabrication operations according to embodiments of the invention. FIG. 1B depicts a cross-sectional view of the semiconductor structure 100 shown in FIG. 1A taken along the line X-X'. FIG. 1C depicts a cross-sectional view of the semiconductor structure 100 shown in FIG. 1A taken along the line Y-Y'.

FIG. 1A depicts a cross-sectional view of a semiconductor structure 100 after initial fabrication operations according to embodiments of the invention. Known fabrication operations have been utilized to form the semiconductor structure 100 at the stage of fabrication shown in FIG. 1A, wherein the semiconductor structure 100 includes a substrate 10 and alternating layers of sacrificial nanosheets 11 and channel nanosheets 12, configured and arranged as shown.

As used herein, a "nanosheet stack" refers to layers of channel nanosheets 12. A nanosheet stack can further include alternating layers of sacrificial nanosheets 11 or materials deposited on the channel nanosheets 12 after removal of the sacrificial nanosheets 11, as will be further described herein. FIG. 1A depicts two nanosheet stacks 13 separated from one another. For ease of discussion, reference is made to operations performed on and to a nanosheet stack 13 having three channel nanosheets 12 alternating with three sacrificial nanosheets 11. In some embodiments of the invention, the nanosheet stack 13 can include any number of channel nanosheets 12 alternating with any number of corresponding sacrificial nanosheets 11.

Non-limiting examples of suitable materials for the substrate 10 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

In some embodiments of the invention, the alternating sacrificial nanosheets 11 and channel nanosheets 12 can be formed by epitaxially growing one layer and then the next until the desired number and desired thicknesses of the nanosheets 11, 12 are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The channel nanosheets 12 can include, for example, monocrystalline Si. The channel nanosheets 12 can have a thickness of, for example, from about 4 to about 10 nanometers (nm) or from about 4 to about 7 nm. In embodiments where the sacrificial nanosheets 11 include SiGe, for example, the SiGe content can be 50% (atomic percent). The sacrificial nanosheets 11 can have a thickness of, for example, about 9 nm. When the sacrificial nanosheets 11 are removed, the channel nanosheets 12 can be spaced apart in the stacking direction by a distance of, for example, about 9 nm. The nanosheet stacks 13 can be separated from one another by a distance of, for example, 15 nm. The substrate 10 can be a bulk semiconductor material that includes Si.

With further reference to FIGS. 1A, 1C, and 2-9, for ease of description and illustration, the substrate 10 is illustrated as extending beyond the channel nanosheets 12 in the Y-Y' direction, similar to the substrate 10 extending beyond the source/drain (S/D) regions 14 as depicted, for example, in FIGS. 1 A and 1B. However, the nanosheets 12 can have a width equal to that of substrate 10 in the Y-Y' direction.

Figure 2:
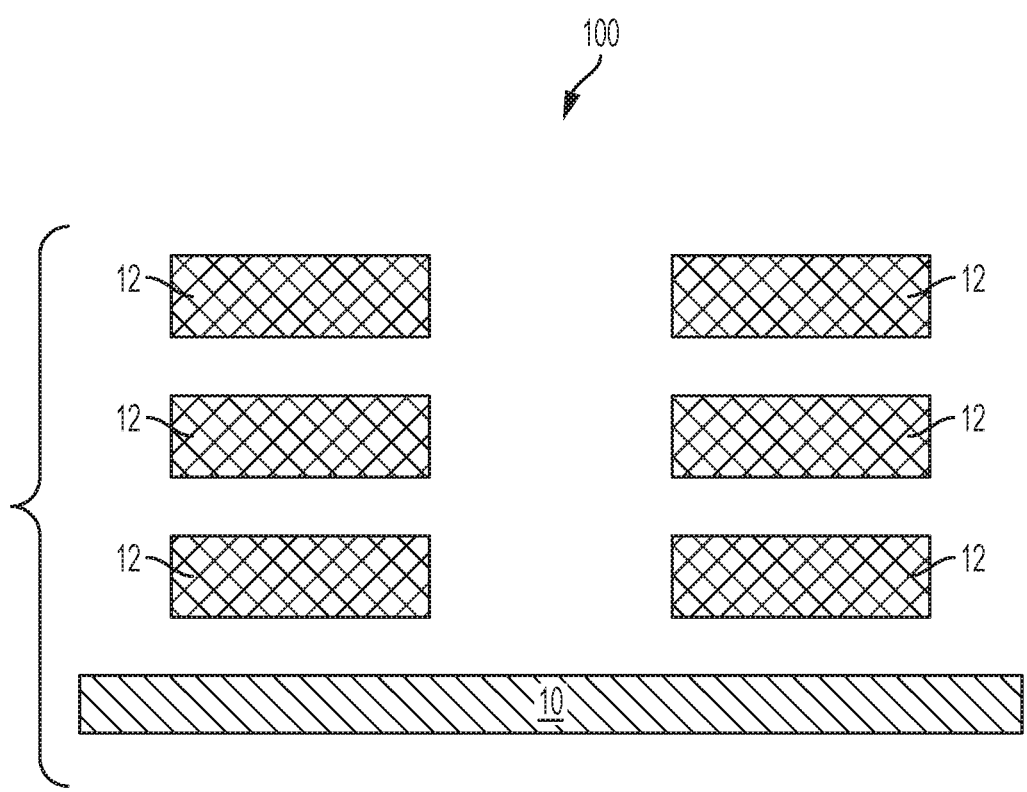
FIG. 2 depicts a cross-sectional view of the semiconductor structure after a fabrication operation according to one or more embodiments of the present invention.

FIG. 2 depicts the same cross-sectional view of the semiconductor structure 100 shown in FIG. 1C after a fabrication operation according to one or more embodiments of the invention. As depicted in FIG. 2, in an operation referred to herein as a "channel release," the sacrificial nanosheets 11 have been removed by a known etching process, e.g., a reactive ion etch (RIE), chemical oxide removal (COR), selective HCl gas etching, etc.

RIE is a form of plasma etching in which during etching the surface to be etched is placed on the RF powered electrode. Moreover, during ME the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

Figure 3:
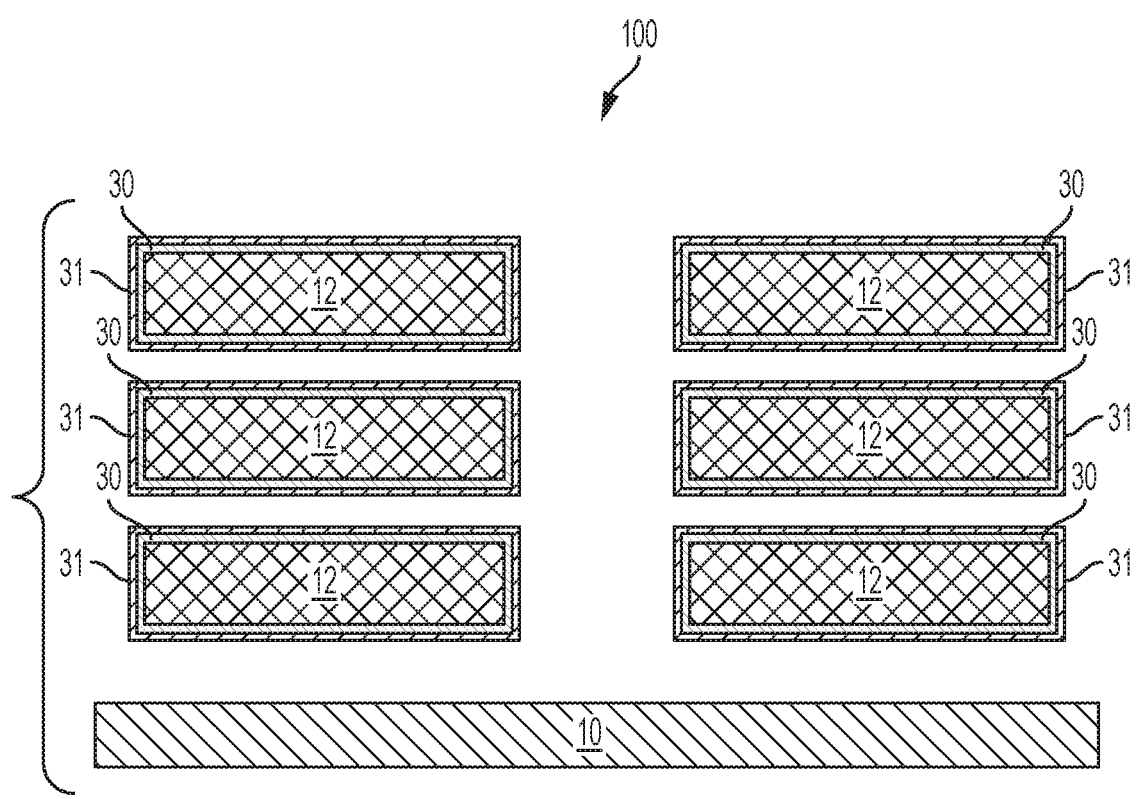
FIG. 3 depicts a cross-sectional view of the semiconductor structure after a fabrication operation according to one or more embodiments of the present invention.

FIG. 3 depicts the same cross-sectional view of the semiconductor structure 100 shown in FIG. 2 after a fabrication operation according to one or more embodiments of the invention. As depicted in the non-limiting embodiment shown in FIG. 3, an interfacial layer 30 is formed on the nanosheets 12. A gate dielectric layer 31 such as, for example, a high-k layer (e.g., $HfO_2$, $ZrO_2$, $HfSiO_4$, $ZrSiO_4$) is deposited on the interfacial layer 30. The interfacial layer 30 encompasses or envelops the nanosheets 12, and the gate dielectric layer 31 encompasses or envelops the interfacial layer 30.

The interfacial layer 30 can include an oxide material such as, for example, $SiO_2$. In one or more embodiments of the invention, the interfacial layer 30 can be a silicon oxide/silicon borocarbonitride (SiBCN) bilayer, which can be formed by CVD, ALD, or a combination thereof. Silicon oxide of the bilayer can be directly on the nanosheets 12, and the SiBCN can be formed on the silicon oxide.

Figure 4:
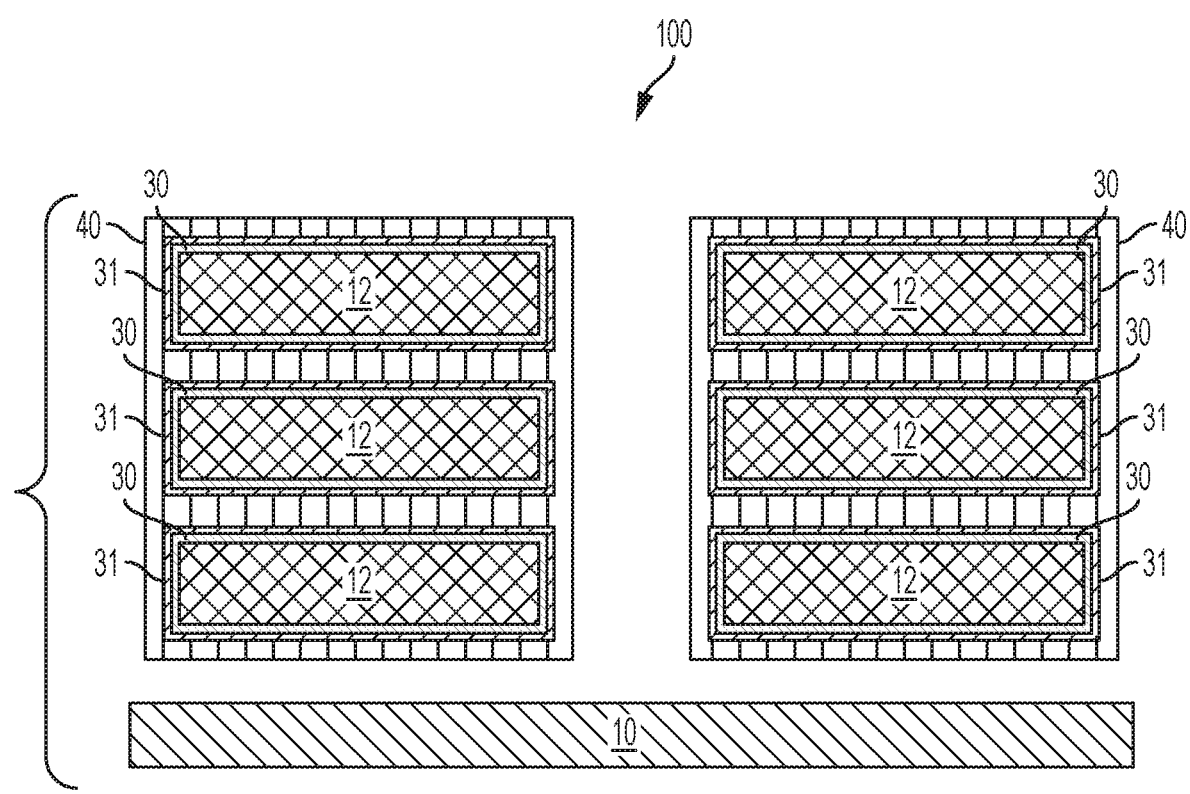
FIG. 4 depicts a cross-sectional view of the semiconductor structure after a fabrication operation according to one or more embodiments of the present invention.

FIG. 4 depicts the same cross-sectional view of the semiconductor structure 100 shown in FIG. 3 after a fabrication operation according to one or more embodiments of the invention. In particular, FIG. 4 depicts the resultant structure 100 following the formation of a metal liner 40 on the gate dielectric layer 31. Metal liner 40 can include TiN, for example, with a Ti/(Ti+N) ratio greater than 0.5. The metal liner 40 can be deposited by, for example, reactive PVD with an optimized $N_2$ flow or an ALD method. As depicted in the non-limiting embodiment shown in FIG. 4, the metal liner 40 is pinched off, or completely fills, spaces between adjacent gate dielectric layers 31.

Figure 5:
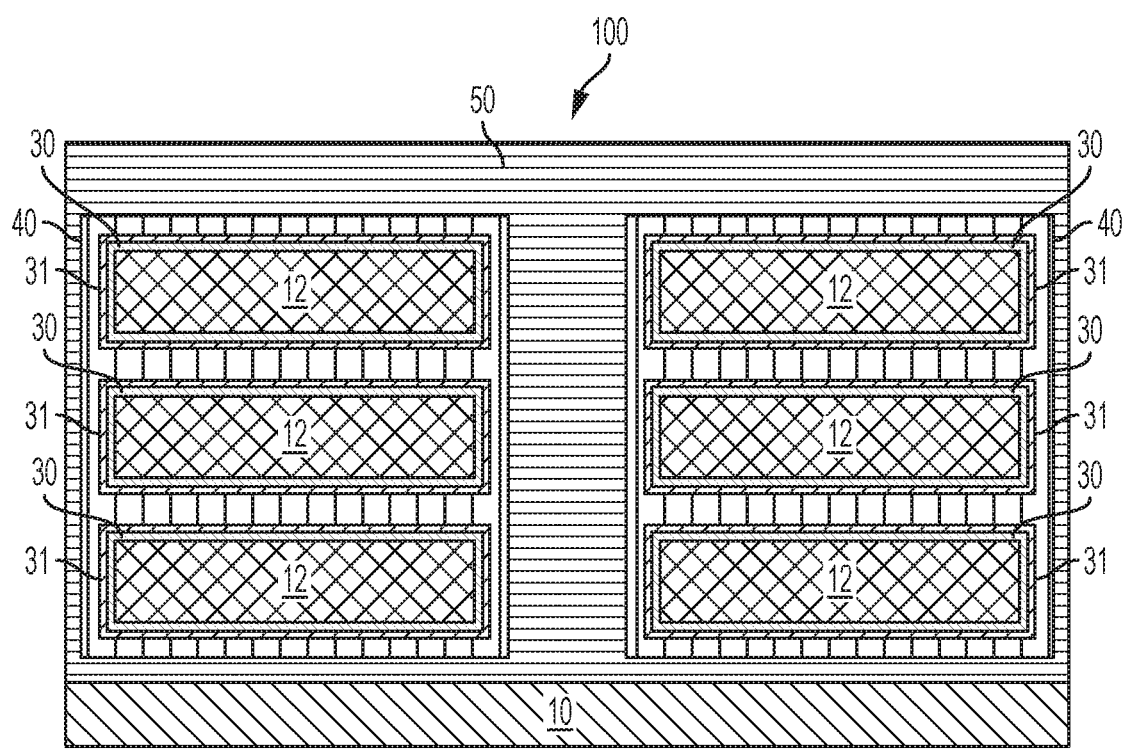
FIG. 5 depicts a cross-sectional view of the semiconductor structure after a fabrication operation according to one or more embodiments of the present invention.

FIG. 5 depicts the same cross-sectional view of the semiconductor structure 100 shown in FIG. 4 after a fabrication operation according to one or more embodiments of the invention. In particular, FIG. 5 depicts the formation of a capping layer 50, such as, for example, amorphous silicon on the metal liner 40. The semiconductor structure 100, for example, the nanosheets 12, interfacial layer 30, gate dielectric layer 31, and metal liner 40, is surrounded by the capping layer 50. The semiconductor structure 100 is then annealed at temperatures between, for example, 400° C. to 600° C., to increase the reliability of the gate dielectric layer 31, which can function as a gate insulation layer. During the annealing, the capping layer 50 prevents oxygen diffusion through the gate dielectric layer 31 to the interfacial layer 30, which can cause regrowth of the interfacial layer 30.

Removal of oxides from the capping layer 50 can be performed, for example, by $NH_3+NF_3$ (ammonia and nitrogen trifluoride) etch or BHF (buffered hydrofluoric acid) wet etch. With respect to the $NH_3+NF_3$ (ammonia and nitrogen trifluoride) etch, the oxide removal, or breakthrough, can be performed by using a variety of different plasmas. In one or more embodiments of the invention, an etching gas mixture is introduced to a chamber for selectively removing various oxides on a surface of the capping layer 50. In one or more embodiments of the invention, ammonia and nitrogen trifluoride gases are introduced into the chamber to form the etching gas mixture. The amount of each gas introduced into the chamber is variable and can be adjusted to accommodate, for example, the thickness of the oxide layer to be removed, the volume capacity of the plasma, the volume capacity of the chamber, as well as the capabilities of the vacuum system coupled to the chamber.

The terms "gas" and "gases" are used interchangeably, unless otherwise noted, and refer to one or more precursors, reactants, catalysts, carrier, purge, cleaning, combinations thereof, as well as any other fluid introduced into the chamber.

The ratio of the etching gas mixture can be predetermined to selectively remove various oxides on the capping layer 50. In one or more embodiments of the invention, the ratio of ingredient in the etching gas mixture can be adjusted to uniformly remove various oxides, such as thermal oxides, deposited oxides, and/or native oxides. In one or more embodiments of the invention, molar ratio of ammonia to nitrogen trifluoride in the etching gas mixture are set to uniformly remove various oxides. In one or more embodiments of the invention, the gases are added to provide a gas mixture having at least a 1:1 molar ratio of ammonia to nitrogen trifluoride. In one or more embodiments of the invention, the molar ratio of the gas mixture is at least about 3 to 1 (ammonia to nitrogen trifluoride). In one or more embodiments of the invention, the gases are introduced in the chamber at a molar ratio of from 5:1 (ammonia to nitrogen trifluoride) to 30:1. In one or more embodiments of the invention, the molar ratio of the gas mixture is of from about 5 to 1 (ammonia to nitrogen trifluoride) to about 10 to 1. The molar ratio of the gas mixture can also fall between about 10:1 (ammonia to nitrogen trifluoride) and about 20:1.

A purge gas or carrier gas can also be added to the etching gas mixture. The purge/carrier gas can be, for example, argon, helium, hydrogen, nitrogen, or mixtures thereof. The overall etching gas mixture can be from about 0.05% to about 20% by volume of ammonia and nitrogen trifluoride, the remainder being the carrier gas.

The capping layer 50 is then etched, for example, by a RIE. As previously described herein, RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation. In one or more embodiments of the invention, the etching includes a radical gas phase etch process.

The etching can include $H_2$ (hydrogen) and a gas including nitrogen and fluorine such as, e.g., $NF_3$ (nitrogen trifluoride), and a purge gas or carrier gas. The purge/carrier gas can be, for example, argon, helium, hydrogen, nitrogen, or mixtures thereof. In one or more embodiments of the invention, the purge or carrier gas is first introduced into the chamber before the reactive gases to stabilize the pressure within the chamber. The operating pressure within the chamber can be variable. The pressure can be maintained between about 500 mTorr and about 30 Torr. In one or more embodiments of the invention, the pressure is maintained between about 1 Torr and about 5 Torr.

In one or more embodiments of the invention, the $NF_3$ flow is about 100 standard cubic centimeters per minute (sccm) to about 300 sccm, the $H_2$ flow is about 1,000 sccm to about 5,000 sccm, and the purge/carrier gas flow is about helium flow of about 200 sccm to about 500 sccm and argon flow 100 sccm to about 1,000 sccm. The etching process can have an etch rate of about 200 angstroms/minute. The etching process can be performed for a time of about 1 minute to about 5 minutes at a temperature up to about 100° C.

The etching is selective versus dielectrics present on wafer, such as, for example, $SiO_2$, TiN, SiBCN, SiN, and $HfO_2$. In one or more embodiments of the invention, SiBCN etch selectivity is greater than 300:1, oxide etch selectivity is greater than 2,000:1, and SiN selectivity is greater than 500:1. As used herein, the term "selective" in reference to a material removal process denotes that the rate of material removal for a first material is greater than the rate of removal for at least another material of the semiconductor structure 100 to which the material removal process is being applied.

Figure 6:
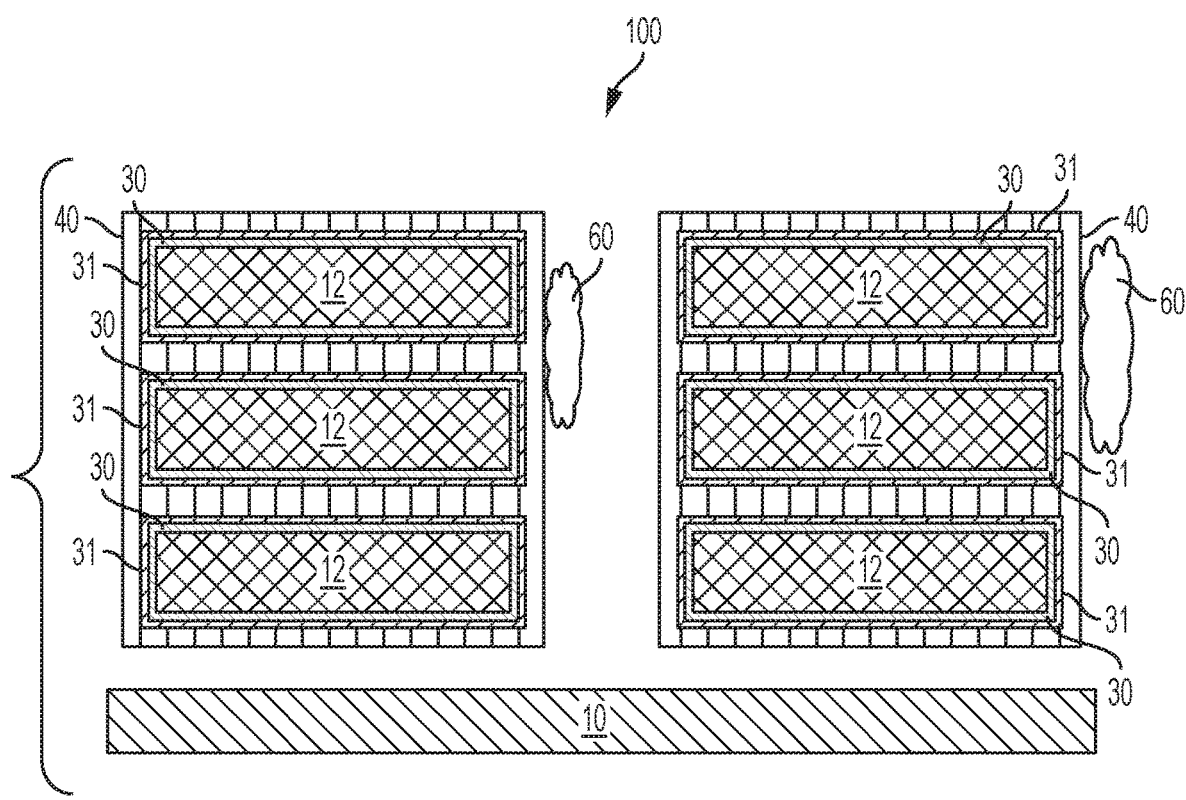
FIG. 6 depicts a cross-sectional view of the semiconductor structure after a fabrication operation according to one or more embodiments of the present invention.

FIG. 6 depicts the same cross-sectional view of the semiconductor structure 100 shown in FIG. 5 after a fabrication operation according to one or more embodiments of the invention. In particular, FIG. 6 depicts residue 60 remaining after an etching of capping layer 50 according to one or more embodiments of the invention. As depicted in the non-limiting embodiment shown in FIG. 6, after removal of the capping layer 50 to expose the metal liner 40, residue 60 remains on portions or surfaces of the metal liner 40. The residue 60 is present on various portions or surfaces of the metal liner 40. The residue 60 includes a solid, $(NH_4)_2SiF_6$, which is a byproduct of the etching of the capping layer 50, e.g., amorphous silicon.

The residue 60 can be removed by a post-etch anneal, or gas phase heat treatment, for example, without damaging the metal liner 40. In one or more embodiments of the invention, the gas phase heat treatment temperature is about 150° C. to about 200° C. and the gas phase heat treatment time is about 1 minute to 5 minutes. Such gas phase heat treatment conditions cause sublimation of the $(NH_4)_2SiF_6$ into $SiF_4$ gas, $NH_3$ gas, and HF gas. Removal of the residue 60 by the gas phase heat treatment avoids need for a subsequent cleaning process, including, for example, hydrofluoric acid (HF), ammonium fluoride ($NH_4F$), and/or ammonium hydroxide ($NH_4OH$). In one or more embodiments of the invention, the gas phase heat treatment is performed in-situ, i.e., without removing the semiconductor structure 100 from the chamber after etching of the amorphous silicon. The residue 60 is removed with minimum damage to portions in or on the semiconductor device structure 100.

Forming the metal liner 40 on the gate dielectric layer 31 on the interfacial layer 30 on channel nanosheets 12 does not provide spaces between adjacent metal liners 40. In particular, as noted above, the metal liner 40 is pinched off, or completely fills, spaces between adjacent gate dielectric layers 31. However, removal of silicon and residue 60 from areas between adjacent stacks can be difficult.

Figure 7:
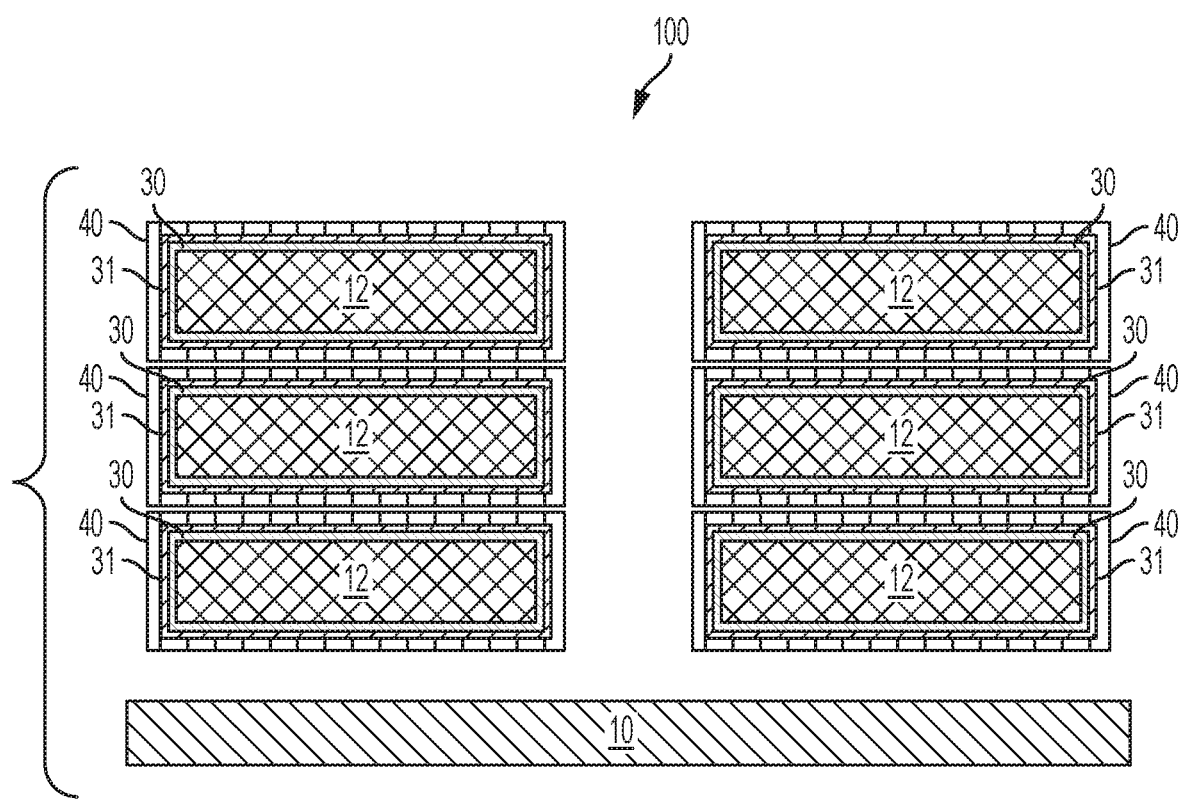
FIG. 7 depicts a cross-sectional view of a semiconductor structure after a fabrication operation according to one or more embodiments of the present invention.

As depicted in the non-limiting embodiment shown in FIG. 7, in one or more embodiments of the invention, after formation of the interfacial layer 30 on the nanosheets 12 (FIG. 3), formation of the metal liner 40 on the gate dielectric layer 31 does not result in the metal liner 40 being pinched off, or completely filling, spaces between adjacent gate dielectric layers 31. Accordingly, FIG. 7 depicts the same cross-sectional view of the semiconductor structure 100 shown in FIG. 3 after a fabrication operation according to one or more embodiments of the invention.

Figure 8:
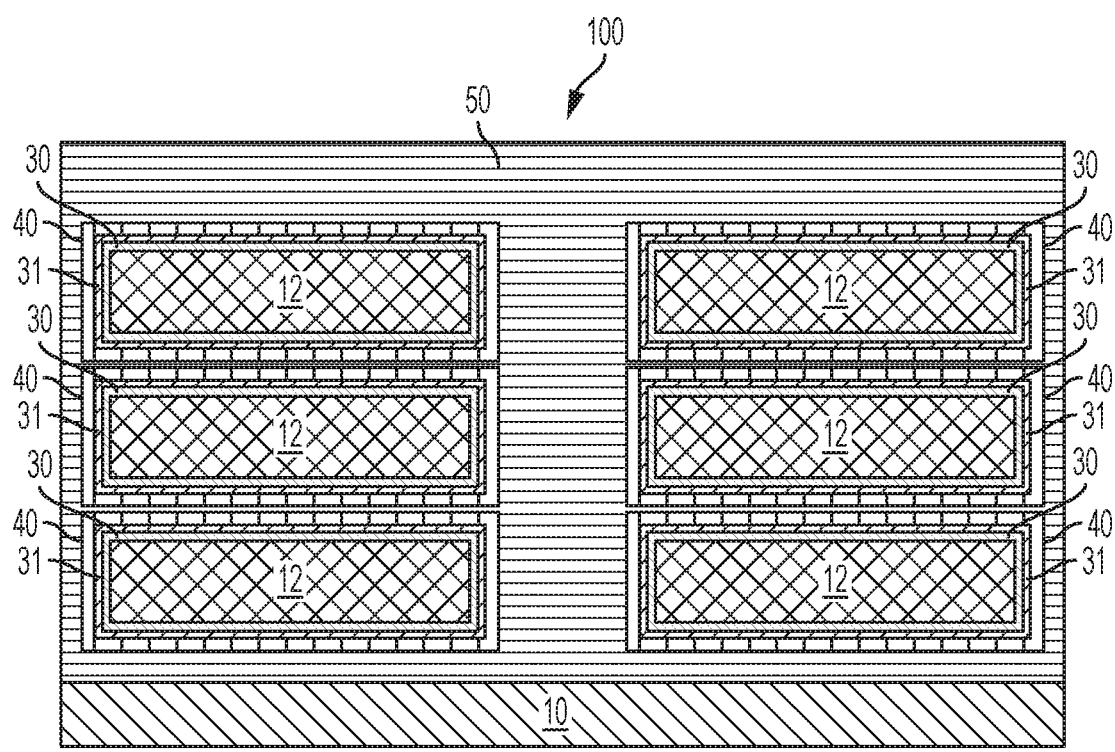
FIG. 8 depicts a cross-sectional view of the semiconductor structure after a fabrication operation according to one or more embodiments of the present invention.

However, as depicted in the non-limiting embodiment shown in FIG. 8, during formation of the capping layer 50 on the on the metal liner 40, the capping layer 50 is present in spaces between adjacent metal liners 40, and the capping layer 50 is pinched off, or completely fills, spaces between adjacent metal liners 40. FIG. 8 depicts the same cross-sectional view of the semiconductor structure 100 shown in FIG. 7 after a fabrication operation according to one or more embodiments of the invention.

Further to the method previously described herein, the semiconductor structure 100 is then annealed at temperatures between, for example, 400° C. to 600° C., to increase the reliability of the gate dielectric layer 31, which can function as a gate insulation layer. During the annealing, the capping layer 50 prevents oxygen diffusion through the gate dielectric layer 31 to the interfacial layer 30, would can cause regrowth of the interfacial layer 30.

Removal of oxides from the capping layer 50 can be performed, for example, by $NH_3+NF_3$ (ammonia and nitrogen trifluoride) etch or BHF (buffered hydrofluoric acid) wet etch. With respect to the $NH_3+NF_3$ (ammonia and nitrogen trifluoride) etch, the oxide removal can be performed by using a variety of different plasmas. In one or more embodiments of the invention, an etching gas mixture is introduced to a chamber for selectively removing various oxides on a surface of the capping layer 50. In one or more embodiments of the invention, ammonia and nitrogen trifluoride gases are introduced into the chamber to form the etching gas mixture. The amount of each gas introduced into the chamber is variable and can be adjusted to accommodate, for example, the thickness of the oxide layer to be removed, the volume capacity of the plasma, the volume capacity of the chamber, as well as the capabilities of the vacuum system coupled to the chamber.

The ratio of the etching gas mixture can be predetermined to selectively remove various oxides on the capping layer 50. In one or more embodiments of the invention, the ratio of ingredient in the etching gas mixture can be adjusted to uniformly remove various oxides, such as thermal oxides, deposited oxides, and/or native oxides. In one or more embodiments of the invention, molar ratio of ammonia to nitrogen trifluoride in the etching gas mixture are set to uniformly remove various oxides. In one or more embodiments of the invention, the gases are added to provide a gas mixture having at least a 1:1 molar ratio of ammonia to nitrogen trifluoride. In one or more embodiments of the invention, the molar ratio of the gas mixture is at least about 3 to 1 (ammonia to nitrogen trifluoride). In one or more embodiments of the invention, the gases are introduced in the chamber at a molar ratio of from 5:1 (ammonia to nitrogen trifluoride) to 30:1. In one or more embodiments of the invention, the molar ratio of the gas mixture is of from about 5 to 1 (ammonia to nitrogen trifluoride) to about 10 to 1. The molar ratio of the gas mixture can also fall between about 10:1 (ammonia to nitrogen trifluoride) and about 20:1.

A purge gas or carrier gas can also be added to the etching gas mixture. The purge/carrier gas can be, for example, argon, helium, hydrogen, nitrogen, or mixtures thereof. The overall etching gas mixture can be from about 0.05% to about 20% by volume of ammonia and nitrogen trifluoride, the remainder being the carrier gas.

The capping layer 50 is then etched, for example, by a ME. As previously described herein, ME is a form of plasma etching in which during etching the surface to be etched is placed on the RF powered electrode. Moreover, during ME the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation. In one or more embodiments of the invention, the etching includes a radical gas phase etch process.

The etching can include $H_2$ (hydrogen) and a gas including nitrogen and fluorine such as, e.g., $NF_3$ (nitrogen trifluoride), and a purge gas or carrier gas. The purge/carrier gas can be, for example, argon, helium, hydrogen, nitrogen, or mixtures thereof. In one or more embodiments of the invention, the purge or carrier gas is first introduced into the chamber before the reactive gases to stabilize the pressure within the chamber. The operating pressure within the chamber can be variable. The pressure can be maintained between about 500 mTorr and about 30 Torr. In one or more embodiments of the invention, the pressure is maintained between about 1 Torr and about 5 Torr.

In one or more embodiments of the invention, the $NF_3$ flow is about 100 sccm to about 300 sccm, the $H_2$ flow is about 1,000 sccm to about 5,000 sccm, and the purge/carrier gas flow is about helium flow of about 200 sccm to about 500 sccm and argon flow 100 sccm to about 1,000 sccm. The etching process can have an etch rate of about 200 angstroms/minute. The etching process can be performed for a time of about 1 minutes to about 5 minutes at a temperature up to about 100° C. The etching is selective versus dielectrics present on wafer, such as, for example, $SiO_2$, TiN, SiBCN, SiN, and $HfO_2$. In one or more embodiments of the invention, SiBCN etch selectivity is greater than 300:1, oxide etch selectivity is greater than 2,000:1, and SiN selectivity is greater than 500:1.

Figure 9:
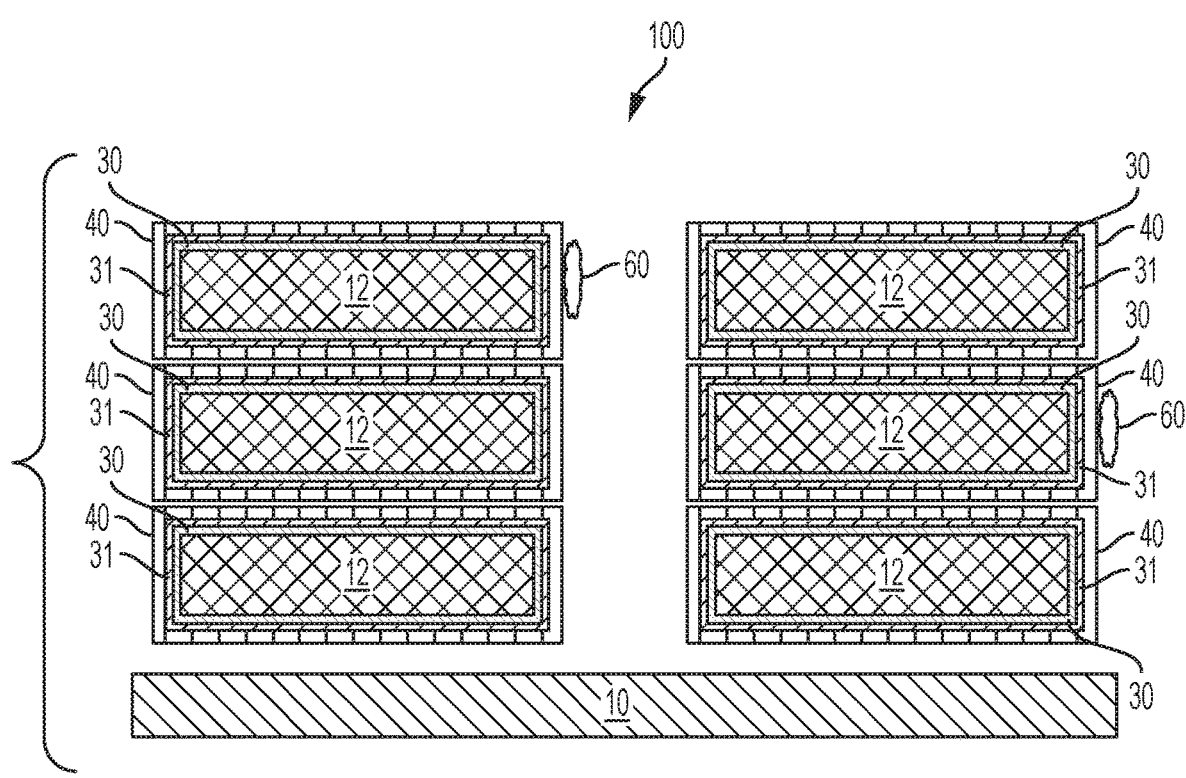
FIG. 9 depicts a perspective view of the semiconductor structure after a fabrication operation according to one or more embodiments of the present invention.

FIG. 9 depicts the same cross-sectional view of the semiconductor structure 100 shown in FIG. 8 after a fabrication operation according to one or more embodiments of the invention. In particular, FIG. 9 depicts residue 60 remaining after an etching of capping layer 50 according to one or more embodiments of the invention. As depicted in the non-limiting embodiment shown in FIG. 9, after removal of the capping layer 50 to expose the metal liner 40, residue

60 remains on portions or surfaces of the metal liner 40. The residue 60 is present on various portions or surfaces of the metal liner 40, including between adjacent metal liners 40. The residue 60 includes a solid, $(NH_4)_2SiF_6$, which is a byproduct of the etching of the capping layer 50, e.g., amorphous silicon.

The residue 60 can be removed by gas phase heat treatment for example, without damaging the metal liner 40. In one or more embodiments of the invention, the gas phase heat treatment temperature is about 150° C.–200° C. and the gas phase heat treatment time is about 1 minute to 5 minutes. Such gas phase heat treatment conditions cause sublimation of the $(NH_4)_2SiF_6$ into $SiF_4$ gas, $NH_3$ gas, and HF gas. Removal of the residue 60 by the gas phase heat treatment avoids need for a subsequent cleaning process, including, for example, hydrofluoric acid (HF), ammonium fluoride ($NH_4F$), and/or ammonium hydroxide ($NH_4OH$). In one or more embodiments of the invention, the gas phase heat treatment is performed in-situ, i.e., without removing the semiconductor structure 100 from the chamber after etching of the amorphous silicon. The residue 60 is removed with minimum damage to portions in or on the semiconductor device structure 100.

Forming the metal liner 40 on the gate dielectric layer 31 on the interfacial layer 30 on channel nanosheets 12 provides narrow spaces between adjacent metal liners 40. The spaces can have a large channel length to width ratio. Accordingly, removal of silicon and residue 60 from such spaces and from areas between adjacent stacks can be difficult.

Following removal of the residue 60 as depicted in either FIG. 6 or FIG. 9, the metal liner 40 is selectively etched, for example, by a ME, and a work function metal (WFM) is deposited on the gate dielectric layer 31. The WFM can be, for example, aluminum, nickel, tantalum, tantalum nitride, titanium, titanium nitride, TiAl alloy, ruthenium, or tungsten, and can be deposited via vapor deposition.

Figure 10:
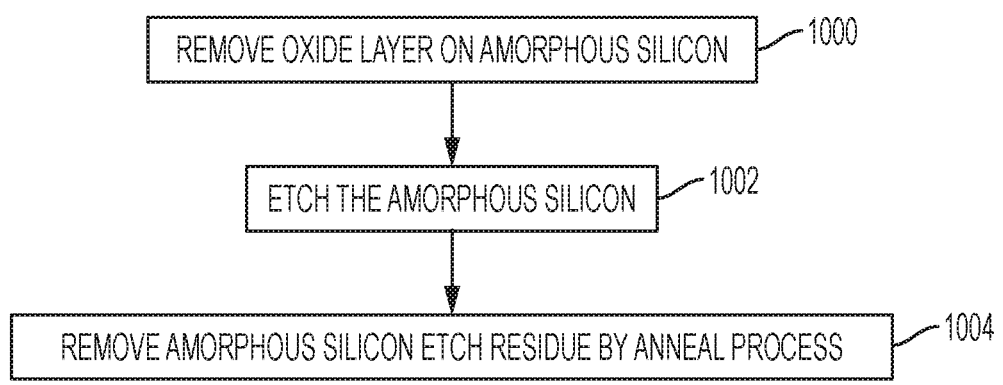
FIG. 10 depicts a flow diagram illustrating a methodology according to one or more embodiments of the present invention.

FIG. 10 depicts a block/flow diagram of an exemplary method for fabricating a semiconductor device according to one or more embodiments of the invention. At block 1000, an oxide layer on amorphous silicon is removed. In one or more embodiments of the invention, the removal is performed by applying $NH_3$ (ammonia) and $NF_3$ (nitrogen trifluoride). In one or more embodiments of the invention, the removal is performed by applying BHF (buffered hydrofluoric acid). At block 1002, the amorphous silicon is etched. The etching process can be, e.g., an RIE process. The etching process involves, e.g., use of $NF_3$ and $H_2$ (hydrogen gas). At block 1004, residue 60 is removed by an anneal process.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a nanosheet semiconductor device, the method comprising:
   forming parallel nanosheet stacks respectively comprising channel nanosheets and interfacial layers formed on each of the channel nanosheets;
   depositing gate dielectric layers on each of the interfacial layers of each of the channel nanosheets;
   forming metal liners directly on each of the gate dielectric layers of each of the channel nanosheets to completely fill spaces between the gate dielectric layers of adjacent channel nanosheets;
   depositing silicon on, between and around the parallel nanosheet stacks;
   etching the silicon;
   exposing the nanosheet stack to a gas phase heat treatment to remove by-products of the etching of the silicon from the metal liners; and
   after the gas phase heat treatment, annealing the nanosheet stack at temperatures between, about 400° C. to about 600° C.

2. The method of claim 1, wherein the nanosheet stack comprises a metal liner on a dielectric layer on the channel nanosheets such that a space is formed between adjacent metal liners and the silicon completely fills the space between the adjacent metal liners.

3. The method of claim 2, wherein etching the silicon comprises forming etch byproducts in the space between the adjacent metal liners.

4. The method of claim 1, wherein the gas phase heat treatment includes a temperature between about 150° C. and about 200° C. for a period of time between about 1 minute and about 5 minutes.

5. The method of claim 1, wherein exposing the nanosheet stack to a temperature between about 150° C. and about 200° C. for a period of time between about 1 minute and about 5 minutes is performed in-situ.

6. The method of claim 1, wherein etching the silicon comprises etching amorphous silicon.

7. The method of claim 1, wherein the gate dielectric layer comprises a high-k dielectric, the metal liner comprises titanium nitride and there is no intervening layer between the metal liner and the gate dielectric layers in each parallel nanosheet stack.

8. A method for forming a nanosheet semiconductor device, the method comprising:
   forming parallel nanosheet stacks respectively comprising channel nanosheets and interfacial layers formed on each of the channel nanosheets;
   depositing gate dielectric layers on each of the interfacial layers of each of the channel nanosheets;
   forming titanium nitride metal liners directly on each of the gate dielectric layers of each of the channel nanosheets to completely fill spaces between the gate dielectric layers of adjacent channel nanosheets;
   depositing silicon on, between and around the parallel nanosheet stacks;

etching the silicon;
exposing the nanosheet stack to a gas phase heat treatment to remove by-products of the etching of the silicon from the titanium nitride metal liners; and
after the gas phase heat treatment, annealing the nanosheet stack at temperatures between, about 400° C. to about 600° C.

9. The method of claim 8, wherein the nanosheet stack comprises a metal liner on a dielectric layer on the channel nanosheets such that the metal liner completely fills a space between adjacent dielectric layers.

10. The method of claim 8, wherein the gas phase heat treatment includes a temperature between about 150° C. and about 200° C. for a period of time between about 1 minute and about 5 minutes.

11. The method of claim 8, wherein etching the silicon comprises etching amorphous silicon.

12. The method of claim 8, wherein exposing the nanosheet stack to a temperature between about 150° C. and about 200° C. for a period of time between about 1 minute and about 5 minutes removes etch byproducts comprising $(NH_4)_2SiF_6$.

13. A method for forming a nanosheet semiconductor device, the method comprising:
forming parallel nanosheet stacks of the nanosheet semiconductor device respectively comprising channel nanosheets, interfacial layers formed on each of the channel nanosheets, gate dielectric layers deposited on each of the interfacial layers of each of the channel nanosheets, titanium nitride metal liners formed directly on each of the gate dielectric layers of each of the channel nanosheets to completely fill spaces between the gate dielectric layers of adjacent channel nanosheets and amorphous silicon deposited on, between and around the parallel nanosheet stacks;
etching the amorphous silicon;
exposing the nanosheet semiconductor device to a gas phase heat treatment to remove by-products of the etching of the amorphous silicon from the titanium nitride metal liners; and
after the gas phase heat treatment, annealing the nanosheet stack at temperatures between, about 400° C. to about 600° C.

14. The method of claim 13, wherein the gas phase heat treatment includes a temperature between about 150° C. and about 200° C. for a period of time between about 1 minute and about 5 minutes.

15. The method of claim 14, wherein exposing the nanosheet semiconductor device to a temperature between about 150° C. and about 200° C. for a period of time between about 1 minute and about 5 minutes is performed in-situ.

16. The method of claim 14, wherein exposing the nanosheet semiconductor device to a temperature between about 150° C. and about 200° C. for a period of time between about 1 minute and about 5 minutes removes etch byproducts.

17. The method of claim 16, wherein the etch byproducts comprise $(NH_4)_2SiF_6$.

18. The method of claim 13, wherein the etching comprises a radical gas phase etch process.

19. The method of claim 18, wherein the etching comprises supplying $NF_3$ to a process chamber at a flow rate between about 100 standard cubic centimeters per minute (sccm) and about 300 sccm.

20. The method of claim 19, wherein the etching further comprises supplying $H_2$ to the process chamber at a flow rate between about 1,000 sccm and about 5,000 sccm.

* * * * *